(12) United States Patent
Wang et al.

(10) Patent No.: US 6,975,407 B1
(45) Date of Patent: Dec. 13, 2005

(54) METHOD OF WAFER HEIGHT MAPPING

(75) Inventors: Chun-Sheng Wang, Jhubei (TW);
Yi-Chang Sung, Jhubei (TW);
Chi-Hung Liao, Sanchong (TW);
Li-Kong Turn, Taichung (TW); Louie Liu, Hsinchu (TW)

(73) Assignee: Taiwan Semiconductor Manufacturing Co, Ltd., (TW)

( * ) Notice: Subject to any disclaimer, the term of this patent is extended or adjusted under 35 U.S.C. 154(b) by 0 days.

(21) Appl. No.: 10/849,455

(22) Filed: May 19, 2004

(51) Int. Cl.[7] .................. G01B 11/00; G03B 27/52
(52) U.S. Cl. .................. 356/601; 356/399; 356/401; 355/55; 355/53; 355/77
(58) Field of Search .................. 356/601, 607–608, 356/629, 635, 639–640, 399–401; 355/53, 355/55, 57; 430/30; 250/548, 201

(56) References Cited

U.S. PATENT DOCUMENTS

| | | | | |
|---|---|---|---|---|
| 5,715,064 A | * | 2/1998 | Lin | .................. 356/401 |
| 5,748,323 A | * | 5/1998 | Levinson | .................. 356/399 |
| 5,864,394 A | * | 1/1999 | Jordan et al. | ............. 356/237.2 |
| 5,917,580 A | * | 6/1999 | Ebinuma et al. | .............. 355/53 |
| 6,208,407 B1 | * | 3/2001 | Loopstra | ...................... 355/53 |
| 6,277,533 B1 | * | 8/2001 | Wakamoto et al. | ........... 430/30 |
| 6,674,510 B1 | * | 1/2004 | Jasper et al. | .................. 355/55 |
| 6,815,947 B2 | * | 11/2004 | Scheiner et al. | ............ 324/230 |
| 6,882,405 B2 | * | 4/2005 | Jasper et al. | ................. 355/55 |

* cited by examiner

*Primary Examiner*—Gregory J. Toatley, Jr.
*Assistant Examiner*—Sang H. Nguyen
(74) *Attorney, Agent, or Firm*—Duane Morris LLP

(57) ABSTRACT

An improved method of wafer height mapping using a wafer level sensor eliminates or substantially minimizes the "spacing" in the wafer height mapping data usually caused by having an exposure field on a wafer whose width is less than the width of the measurement spot array of the wafer level sensor and also not being a multiple of the width of a single measurement spot. According to the improved method, the measurement spot array is first translated towards one edge of the exposure field and scanned. Then the measurement spot array is translated towards the other edge of the exposure field and scanned second time to map the area that was missed during the first mapping scan.

12 Claims, 9 Drawing Sheets

METHOD OF WAFER HEIGHT MAPPING

The present invention relates to wafer height detection and level sensing, for use in lithographic equipment and more particularly to an improved method of wafer height mapping.

In the manufacture of integrated circuits, lithographic projection apparatus can be used to expose circuit patterns for each layer of the integrated circuit onto an exposure area on a semiconductor wafer substrate. Generally, the semiconductor wafer substrate is coated with a layer of photosensitive material, such as photoresist, during a typical integrated circuit manufacturing process in order to expose and develop the photoresist with the circuit patterns. The circuit patterns are imaged on to the photoresist-coated semiconductor wafer through a mask or a reticle.

Generally, a single semiconductor wafer contains an array of adjacent dies (exposure area) which are successively irradiated (exposed) via a reticle, one at a time. In one type of photolithographic apparatus, each exposure area is irradiated by exposing the entire reticle pattern on to the exposure area at once. Such apparatus is commonly referred to as a wafer stepper. In another type of photolithographic apparatus, step-and-scan apparatus, each exposure area is irradiated by progressively scanning the reticle pattern under the projection beam in a given reference direction while synchronously scanning the wafer table parallel or antiparallel to this direction.

In both types of lithographic apparatus, it is important that the reticle images are focused accurately on the exposure area of the wafer surface. Although, wafers are polished to a very high degree of flatness, a typical wafer surface will exhibit areas that sufficiently deviate from perfect flatness that may affect the focus accuracy of lithographic apparatus. To address this problem, and to ensure that the reticle image is accurately focused on the exposure area of the wafer surface, most lithographic apparatuses are provided with a device called a wafer level sensor that generates a map of wafer height to be used by the image projection system of an exposure tool to focus the reticle image on to the wafer's exposure areas. After a wafer is loaded on a wafer table, the wafer table first positions the wafer under the level sensor which maps the top surface of the wafer to gain topographical data to aid in focusing of the reticle image during the image exposure process.

The level sensor measures the height of the wafer surface, relative to a physical reference surface of the wafer table at each of the exposure area of the wafer and generates a map of the wafer containing the surface height information for each of the exposure area on the wafer. This is otherwise known as wafer leveling or height mapping. Because the wafer height map contains height information of the wafer surface measured relative to a physical reference surface of the wafer table, the exposure tool can calculate the vertical position of the exposure area on the wafer from the physical reference surface of the wafer table, which is always at a fixed predetermined position. The exposure tool then adjusts the focal plane of the projection beam to coincide with the surface of the exposure area.

The wafer height mapping scan (also called a measurement scan) conducted by a wafer level sensor in these lithographic apparatus will now be discussed to describe the shortcomings of such system which will be addressed by the present invention. FIG. 1, shows an example of a pattern of exposure areas C of various shapes and sizes arranged on a wafer 10. The different exposure areas C represent different dies and are separated by scribe lanes SL.

Wafer level sensors measure the height of a wafer surface using optical sensors based on moiré interference and the detailed workings of the optics involved need not be discussed here. An example of a lithographic apparatus utilizing such wafer level sensor is the TwinScan® system available from ASML Netherlands B. V. and a detailed description of the operation of the wafer level sensor may be found in ASML's U.S. Pat. No. 6,674,510 to Jasper et al., the disclosure of which is hereby incorporated by reference in its entirety.

A typical wafer level sensor uses nine measurement spots to measure the height of the wafer surface during its measurement scan. The nine measurement spots are shown in FIG. 1 as a linear array of nine optical spots 50 (interchangeably referred to herein as measurement spots) arranged perpendicular to the scanning direction. The array of measurement spots is of a size sufficient to cover the width of the widest exposure area that can be exposed in the apparatus. In this example, the linear array of nine spots 50 is sufficiently wide to cover the widest column of exposure areas, the column A, on the wafer 10.

During the measurement scan, the wafer level sensor scans the array of nine spots in a meander path 20 so that the center spot 52 of the array 50 passes along the center line of each column of exposure areas. Where the column of exposure areas (exposure field) is the same width as the width of the array of the measurement spots 50, as in the case of the column A, one measurement scan will cover the full width of the exposure field with the measurement spots. This is illustrated in FIG. 2 with each of the nine measurement spots having a width of W and the spacing between the measurement spots being represented by S. The width E of the exposure field is the same as the width of the nine measurement spots.

However, as illustrated in FIG. 3, when the wafer level sensor is measuring the columns B and C of exposure areas on the wafer 10, for example, the width of the exposure field in those columns are narrower than the width of the array of measurement spots 50. The result is that some of the measurement spots 50a fall completely within the exposure field being scanned while other measurement spots fall, either partially or completely, outside the exposure field being scanned. Measurement spots 50b are partially outside the exposure field and measurement spots 50c are completely outside the exposure field. Typical wafer level sensors are programmed to ignore the height data from these measurement spots since they are not useable. This means that the areas 60 and 61 of the exposure field do not get measured. This will result in a wafer mapping data having areas of missing height data or "spacing" between the scanned exposure fields. FIG. 4 is an illustration of a wafer 70, where the mapped data, represented by the shaded area 72, is overlaid on the grid of exposure fields 75 (i.e., the grid of dies). The areas 77 between the mapped areas 72 represent the "spacing" or the unmapped regions.

Since the width of the exposure fields vary depending on the particular die designs, the width of the exposure fields can vary from wafer to wafer and can vary within a wafer from column to column, as shown in the wafer 10 of FIG. 1. Thus, one can see that the problem described above does not exist even when the width E of the exposure area is less than the total width of the nine measurement spots in the array 50 as long as the width E of the exposure area is substantially equal to a multiple of the width W of a single measurement spot. FIG. 5 illustrates a case where the width E of the exposure area is a multiple of the width W of a single measurement spot. Specifically, E, in this example, is about five times W. For the purpose of this discussion, the spacing S between the measurement spots will be ignored since S is generally substantially smaller than W. Because the width E of the exposure field is about five times W, the center five measurement spots 50a will measure the full width of the exposure field.

Thus, when the width of one or more columns of exposure fields on a wafer is not substantially equal to a multiple of the width of a measurement spot, the wafer mapping data will have strips of unmeasured areas and will not properly represent the whole wafer. If only one exposure field on a wafer presents this condition, it may not cause much of a problem. However, if many or all of the exposure fields on a wafer meet this condition, substantial portion of the exposure fields of the wafer will not get measured. This can result in focusing problems during the reticle image exposure process.

Thus, there is a need for an improved wafer level sensor where partial measurement scan of the exposure areas is minimized or substantially eliminated.

SUMMARY

According to an aspect of the present invention, an improved method of wafer height mapping to eliminate or substantially minimize the "spacing" in the wafer height mapping data is disclosed. According to an embodiment of the present invention, the method of wafer height mapping comprises the wafer level sensor first determining exposure area's edge positions. The level sensor's array of measurement spots is aligned to the exposure field. The level sensor's linear array of measurement spots is translated or moved perpendicular to the scan direction so that one of the two edges of the exposure area is substantially flush with the edge of a first of the measurement spots. The column of the exposure areas (hereinafter referred to as an "exposure field") is scanned and mapped. Next, the array of measurement spots is translated for the second time in the direction opposite the first translation until the opposite edge of the exposure field is flush with the nearest measurement spot. The exposure field is then scanned and mapped for the second time, thus, generating a mapped height data for the portion of the exposure field that was not mapped during the first scan.

According to another embodiment of the present invention, the method of wafer height mapping further comprises a step of merging the first and second mapped height data for the exposure field.

According to another embodiment of the present invention, the method of wafer height mapping further comprises an initial step of first determining whether the width of a given exposure field is a multiple of the width of a single measurement spot. This step allows the wafer level sensor to determine whether the translation steps and double scanning of an exposure field is necessary. If the width of a given exposure field is a multiple of the width of the single measurement spot, the exposure field may be mapped by a single scan of the exposure field. Thus, the wafer level sensor will not perform the additional steps of translating the measurement spot array and double scanning exposure fields where the additional steps are not necessary.

The movement of translating the array of measurement spots disclosed herein refers to a relative motion between the array of measurement spots and the exposure field of the wafer. And this relative motion may be achieved by either moving the wafer (i.e. by moving the wafer stage) relative to the measurement spots (which is produced by the projection and detection components of the wafer level sensor) or moving the measurement spot array (i.e. moving the projection and detection components of the wafer level sensor) relative to the wafer (i.e. by moving the wafer stage).

BRIEF DESCRIPTION OF THE DRAWINGS

The invention will be better understood from the following detailed description of exemplary embodiments thereof in conjunction with the accompanying drawings in which.

Features shown in the above referenced drawings are not intended to be drawn to scale, nor are they intended to be shown in precise positional relationship. Like reference numbers are used to illustrate like features in the various drawings.

DESCRIPTION

The method of wafer height mapping according to an embodiment of the present invention eliminates or substantially reduces the "spacing" in the wafer height mapping data observed in a conventional wafer level sensor system when the width E of the column of exposure areas is less than the width of the wafer level sensor's measurement spot array and the width E is not a multiple of the width W of a single measurement spot of the wafer level sensor. A column of exposure areas on a wafer will be referred to throughout this document as an "exposure field."

Figure 6:
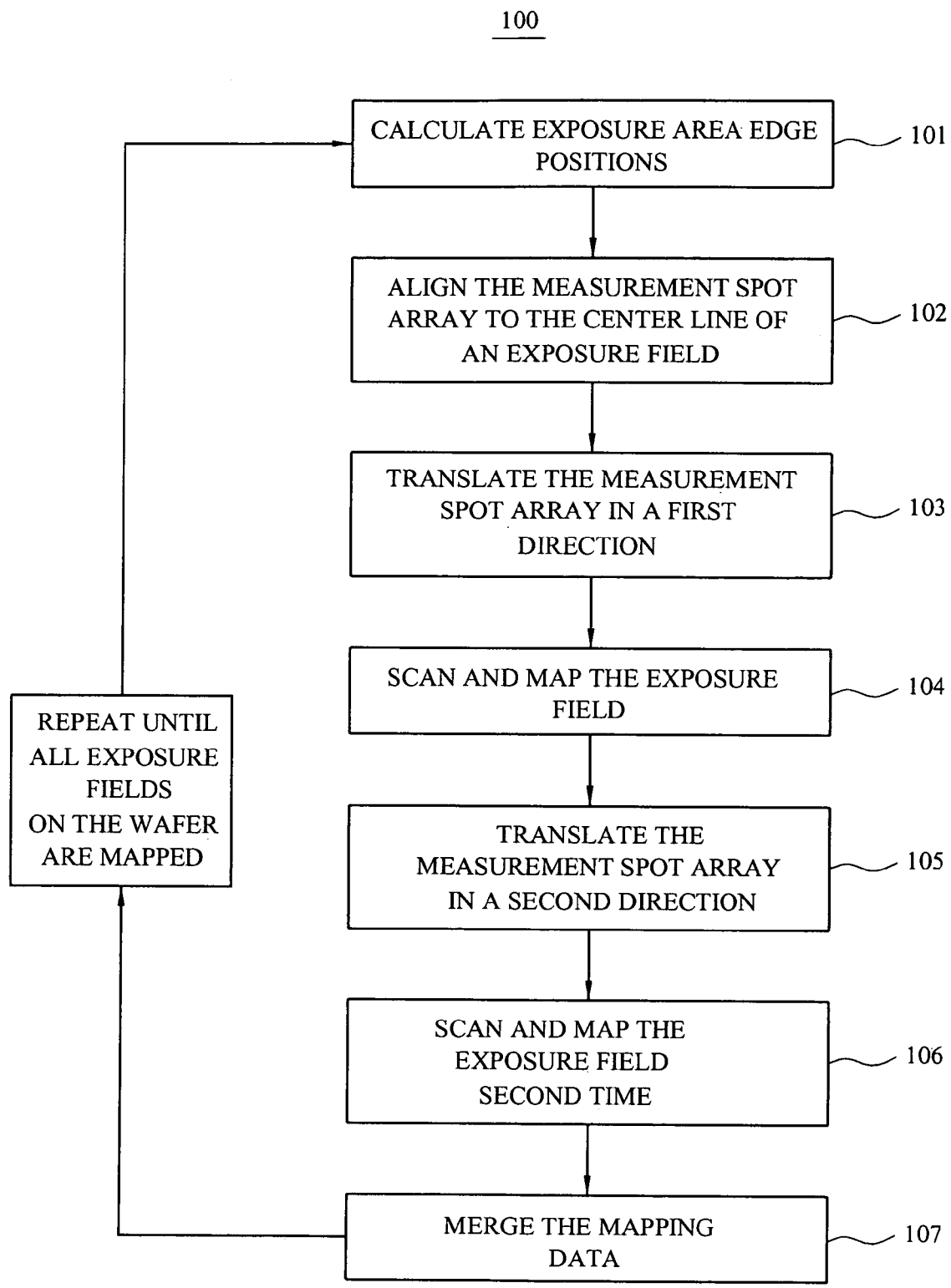
FIG. 6 is a flow chart illustration of the steps involved in the method of wafer height mapping according to an embodiment of the present invention.

FIG. 6 is a flow chart 100 illustrating the steps of an exemplary method according to an embodiment of the present invention.

At step 101, before the wafer level sensor begins mapping a wafer, the wafer level sensor's software determines the edge positions of each of the exposure field. First, level sensor circles the wafer edge and shine a light beam on the edge. The reflection light signal will be received by a level sensor receiver. After modeling, the wafer edge leveling data will be collected. The details of how the software determines the edge positions of each of the exposure field is well known in the art and need not be discussed further.

At step 102, the array of measurement spots is aligned to an exposure field (i.e., a column of exposure areas) on the wafer to be scanned. In this initial alignment, the linear array of measurement spots is centered on the exposure filed (i.e., the center measurement spot of the nine spot array is aligned to the center line of the exposure field) as in the conventional wafer level sensor system.

Figure 7:
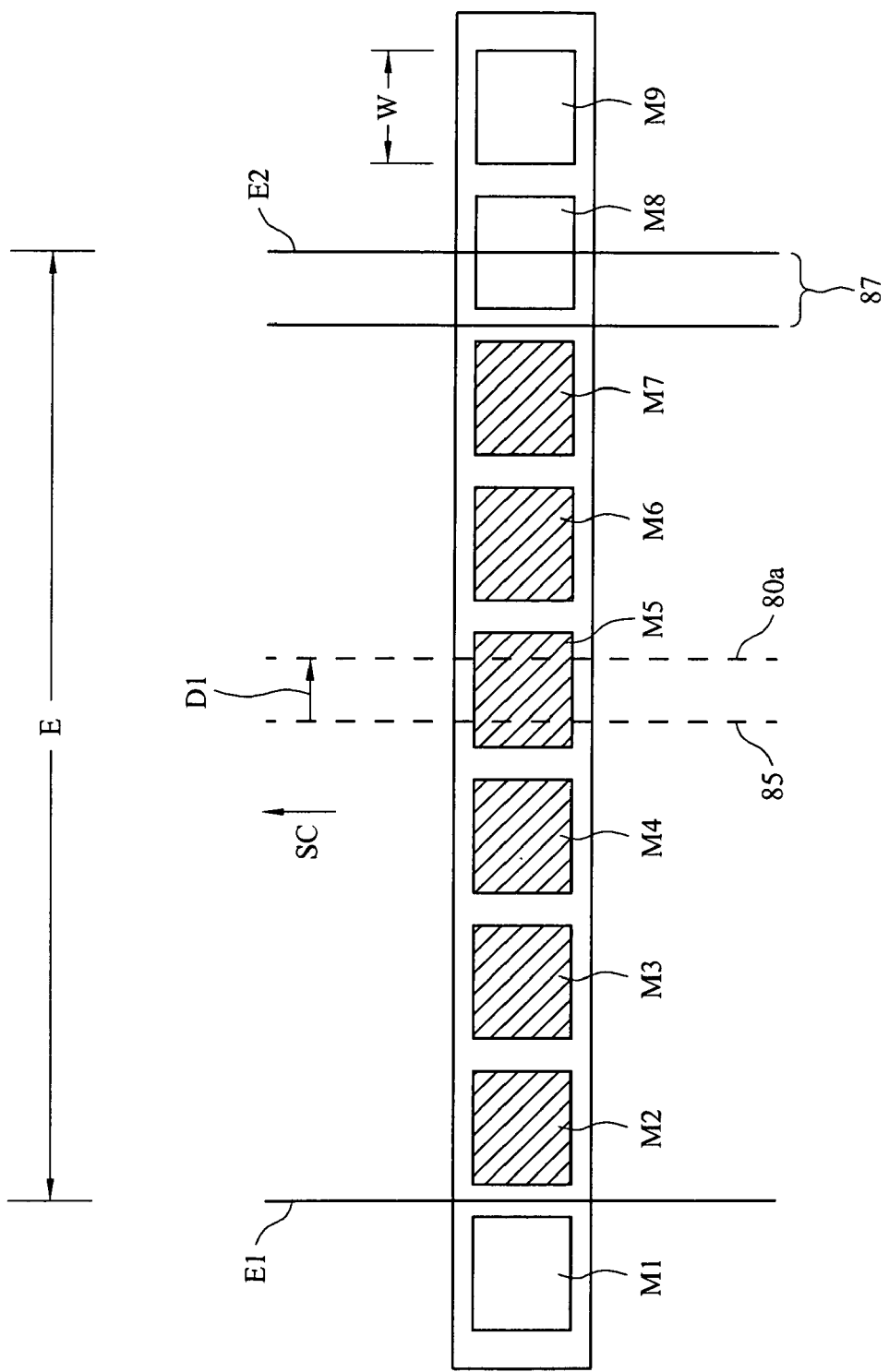
FIG. 7 is a plan view illustration of a measurement spot array illustrating the first scan over an exposure field according to an embodiment of the present invention, wherein the measurement spot array has been translated in the first direction.

At step 103, the wafer level sensor's array of measurement spots is translated in a first direction perpendicular to the scan direction so that one edge of the exposure field is substantially flush with an edge of the nearest measurement spot and the measurement spot being within the exposure field. This is illustrated in FIG. 7. The center 80 of the array of measurement spots is translated in a first direction D1 from the center line 85 of the exposure field so that the exposure field's edge E1 is substantially flush with the edge of the nearest measurement spot M2. The first direction D1 is perpendicular to the scan direction SC. As can be seen, measurement spots M2 through M7 are fully within the exposure field and measurement spots M1, M8 and M9 are not. Of course, one should note that if the exposure field width E was the same as the width of the array of measurement spots or a multiple of the width W of a single measurement spot, there would not be any need to translate the measurement spot array since the edge E1 of the exposure field would be substantially flush with the edge of the nearest measurement spot.

At step 104, the exposure field is scanned and mapped, generating a first mapped height data of the exposure field. As illustrated in FIG. 7, however, the first mapped height data for this exposure field would be a partial representation of the exposure field. The data from the measurement spot M8 substantially covering the area 87 would be discarded because the measurement spot is not wholly within the exposure area.

Figure 8:
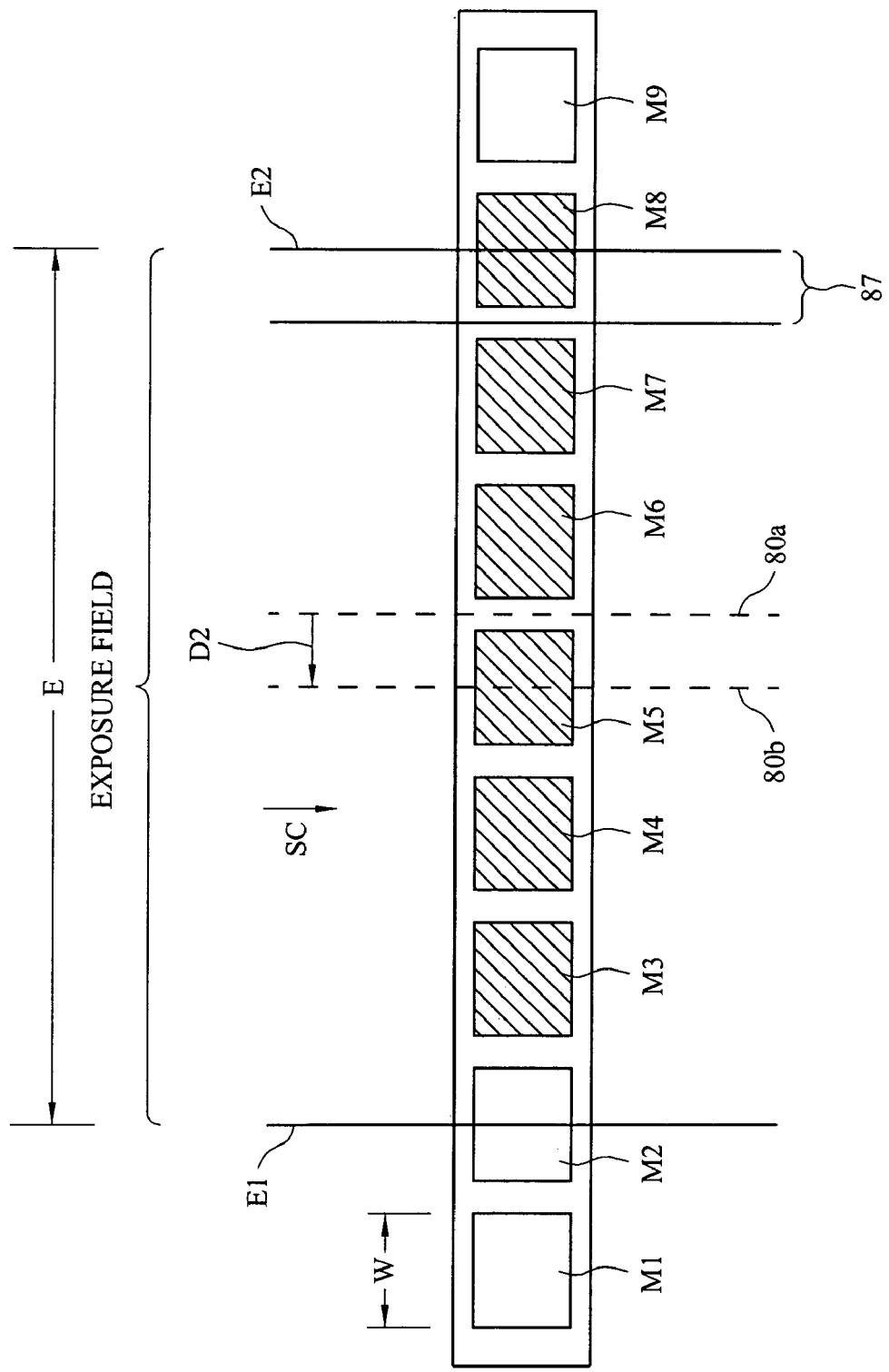
FIG. 8 is a plan view illustration of a measurement spot array illustrating the second scan over an exposure field according to an embodiment of the present invention, wherein the measurement spot array has been translated in the second direction.

At step 105, the measurement spot array is translated in a second direction, opposite the first translation direction, towards the second edge of the exposure field, until the second edge of the exposure field is substantially flush with a nearest measurement spot, the measurement spot being within the exposure field. This is illustrated in FIG. 8. The center of the array of measurement spots is translated in a second direction D2 from the previous position 80a to a second position 80b so that the exposure field's second edge E2 is substantially flush with the edge of the nearest measurement spot M8. The second translation direction D2 is opposite the first direction D1 and perpendicular to the scan direction SC. As can be seen, after this second translation, the measurement spots M3 through M8 are fully within the exposure field and measurement spots M1, M2 and M9 are not. But more importantly, the area 87, which was not mapped during the first scan is now covered by the measurement spot M8 and will be mapped in subsequent scanning.

The translation of the measurement spot array discussed herein refers to a relative motion between the measurement spot array and the exposure field (which is on the wafer). Thus, the translation of the measurement spot array may be produced by either moving the wafer stage (and thus the wafer) relative to the measurement spot array (which is produced by the projection and detection components of the wafer level sensor) or moving the measurement spot array (i.e. moving the projection and detection components of the wafer level sensor) relative to the wafer (i.e. by moving the wafer stage).

At step 106, the exposure field is scanned and mapped for the second time generating a second mapped height data for the exposure field. The second mapped height data, however, includes mapped height data for the portion of the exposure field that was not mapped during the first scan. As illustrated in FIG. 8, the mapped height data from this second scanning of this exposure field includes mapped data for the area 87.

At step 107, the central processing unit (not shown) which manages the operation of the wafer level sensor would merge the mapping data from the two scan runs to generate a full height mapping data for the particular exposure field with out any "spacing." This data merging step conducted by the central processing unit of a wafer level sensor is well known in the art and further details need not be discussed.

The steps 101 through 107 may be repeated until all exposure fields of the wafer are mapped.

Figure 1:
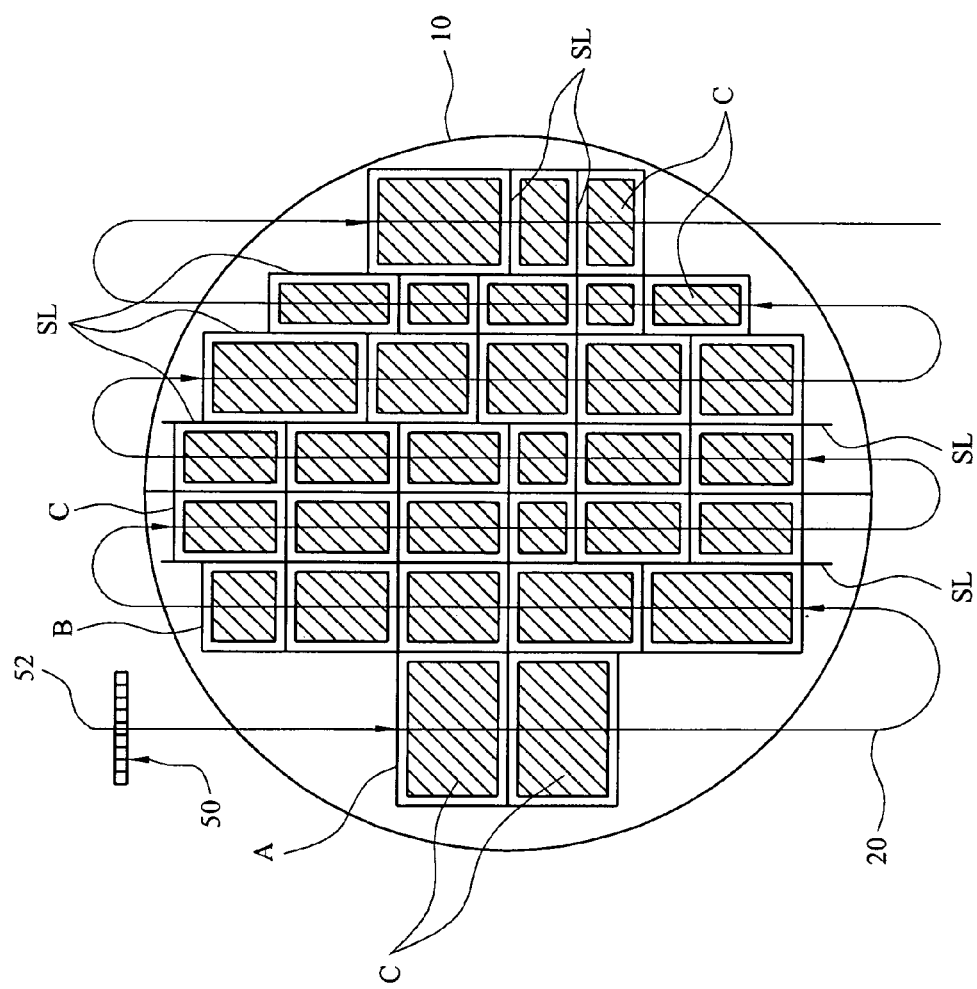
FIG. 1 is a plan view illustration of a wafer showing the wafer height mapping scan path conducted by a conventional wafer level sensor.
Figure 2:
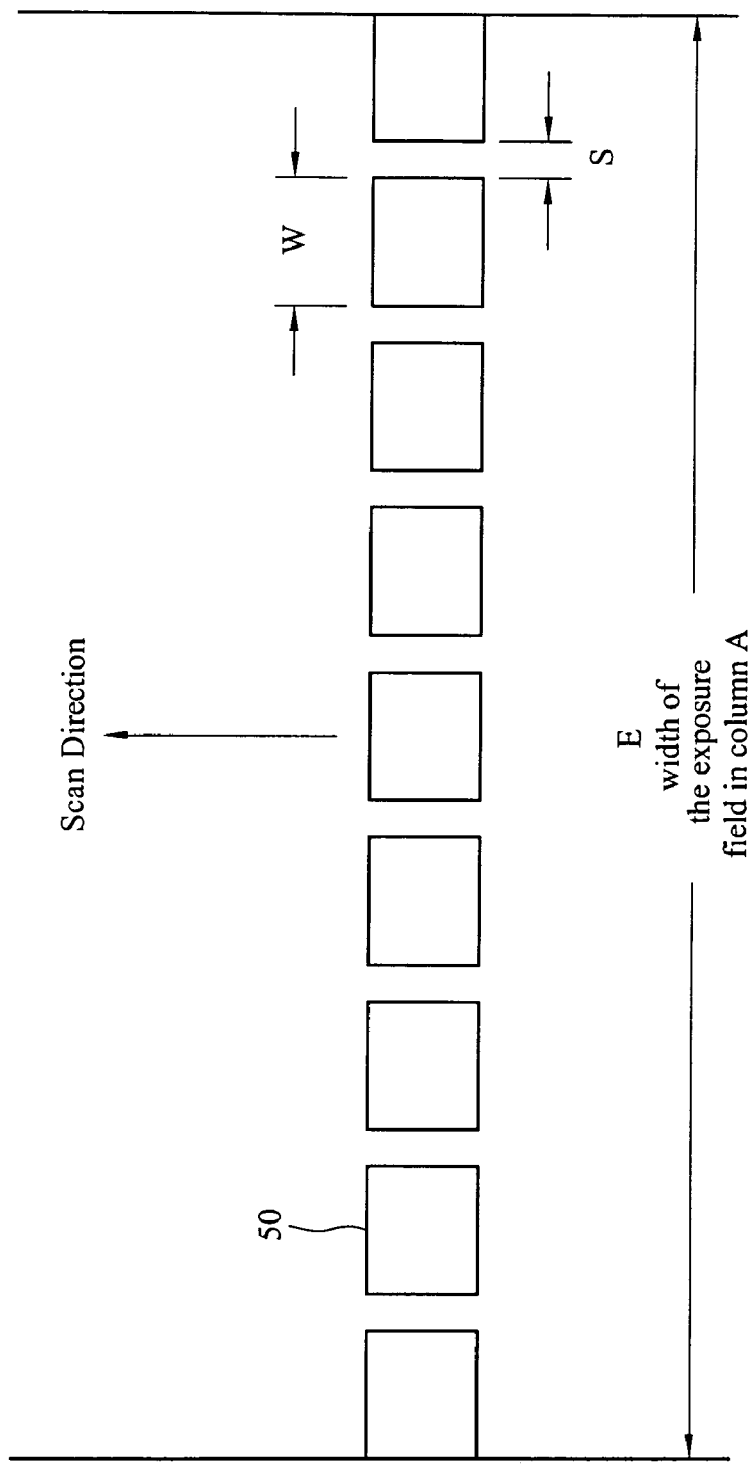
FIG. 2 is a plan view illustration of a measurement spot array scanning over an exposure field according to a conventional wafer height mapping method, wherein the exposure field width is same as the width of the measurement spot array.
Figure 3:
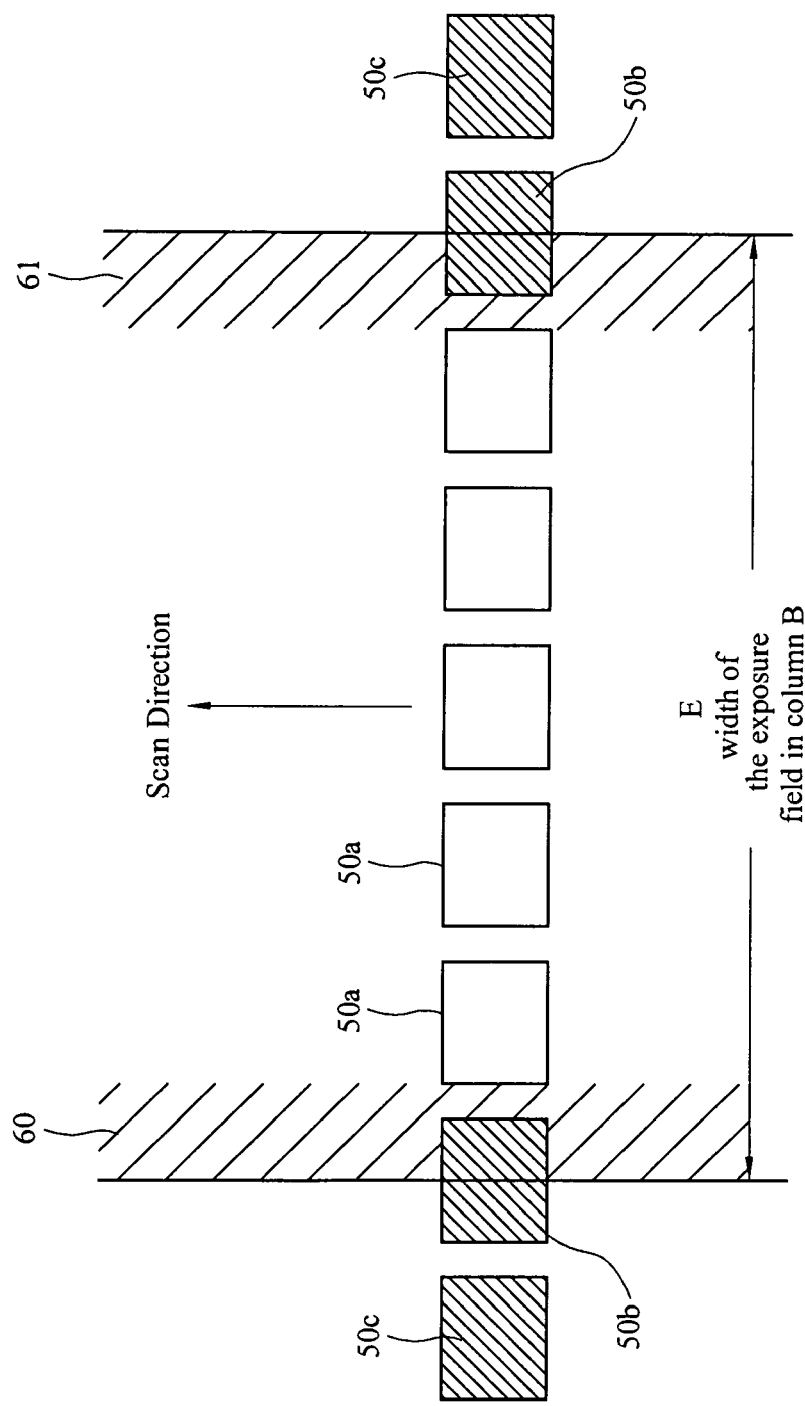
FIG. 3 is a plan view illustration of a measurement spot array scanning over an exposure field according to a conventional wafer height mapping method, wherein the exposure field width is less than the width of the measurement spot array and not being a multiple of the width of a single measurement spot.
Figure 4:
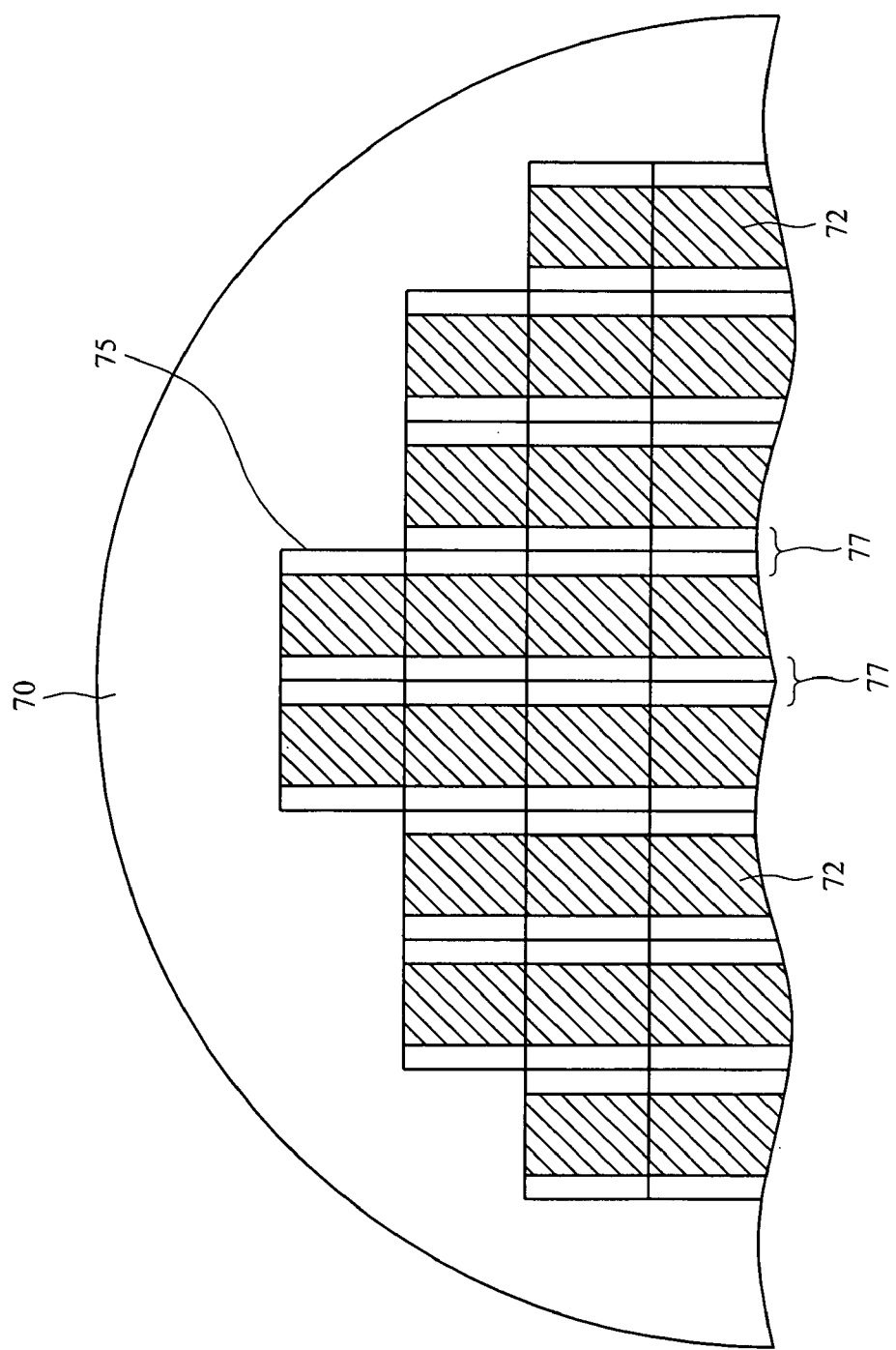
FIG. 4 is a plan view illustration of a wafer height map data generated by a conventional wafer level sensor overlaid on a wafer's exposure area grid.
Figure 5:
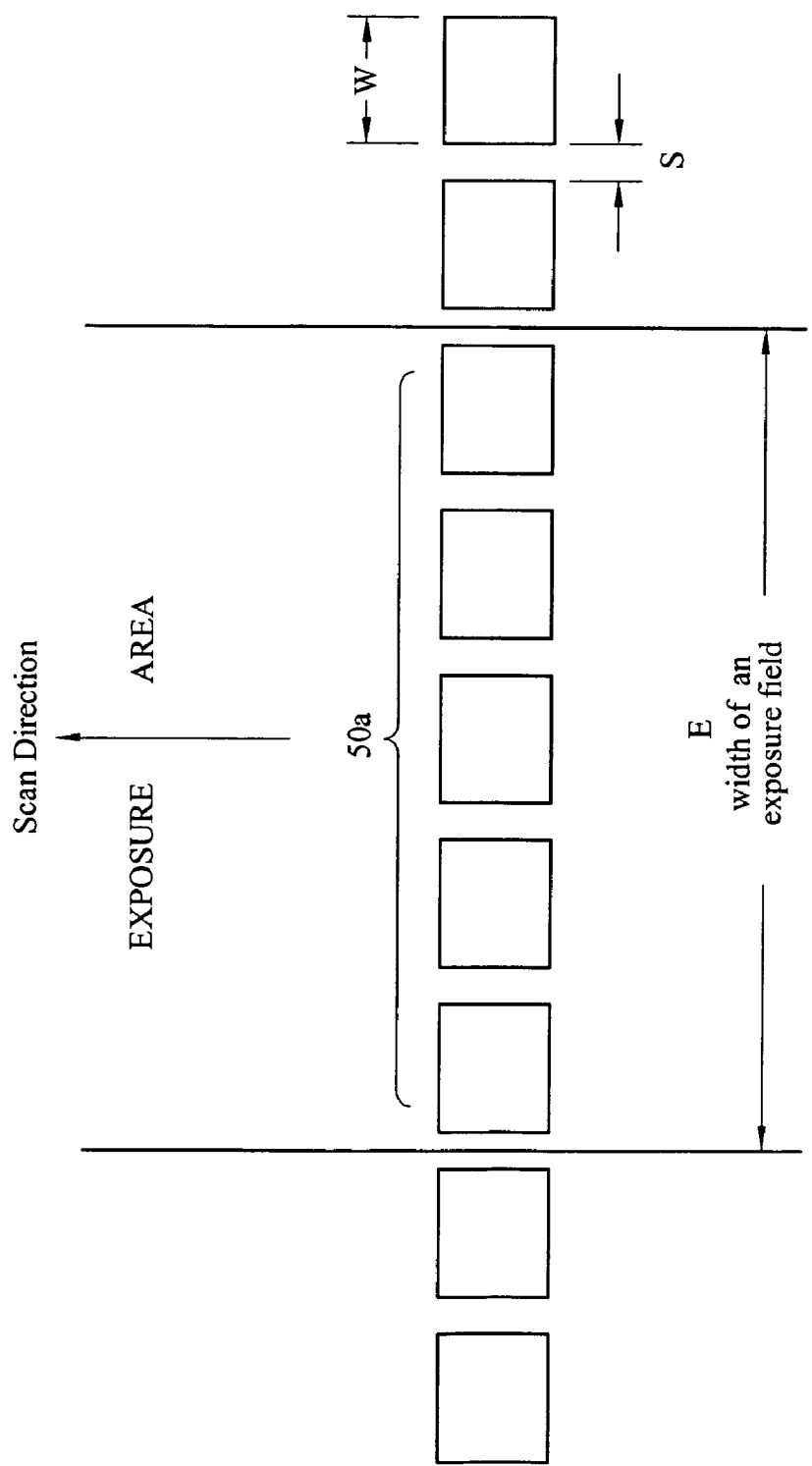
FIG. 5 is a plan view illustration of a measurement spot array scanning over an exposure field according to a conventional wafer height mapping method, wherein the exposure field width is less than the width of the measurement spot array but being a multiple of the width of a single measurement spot.

According to another preferred embodiment of the present invention, the method of wafer height mapping further comprises determining, first, whether the particular exposure field can be scanned once using the conventional method (i.e., with the measurement spot array aligned to the center of the exposure field) or the steps of translating the measurement spot array and double scanning the exposure field is required. This determination can be done by comparing the width of the particular exposure field to the known width of a single measurement spot. As discussed in reference to FIGS. 2, 3 and 5, if the width E of the exposure field is a multiple of the width W of a single measurement spot, that exposure field can be captured fully by the measurement spot array and the scanned map data would contain a full height map data for that exposure field. In other words, if the width E of the exposure field is a multiple of the width W of a single measurement spot, substantially all of the exposure field can be captured by the measurement spot array without any of the measurement spots partially falling in the exposure field. Thus, if the wafer level sensor determines that the width E of a particular exposure field meets this requirement, that exposure field only needs to be scanned one time in a conventional manner (i.e., with the measurement spot array aligned to the center line of the exposure field). The over all wafer height mapping process will be more efficient since the additional steps of translating and double scanning exposure fields will only be conducted where necessary.

Figure 9:
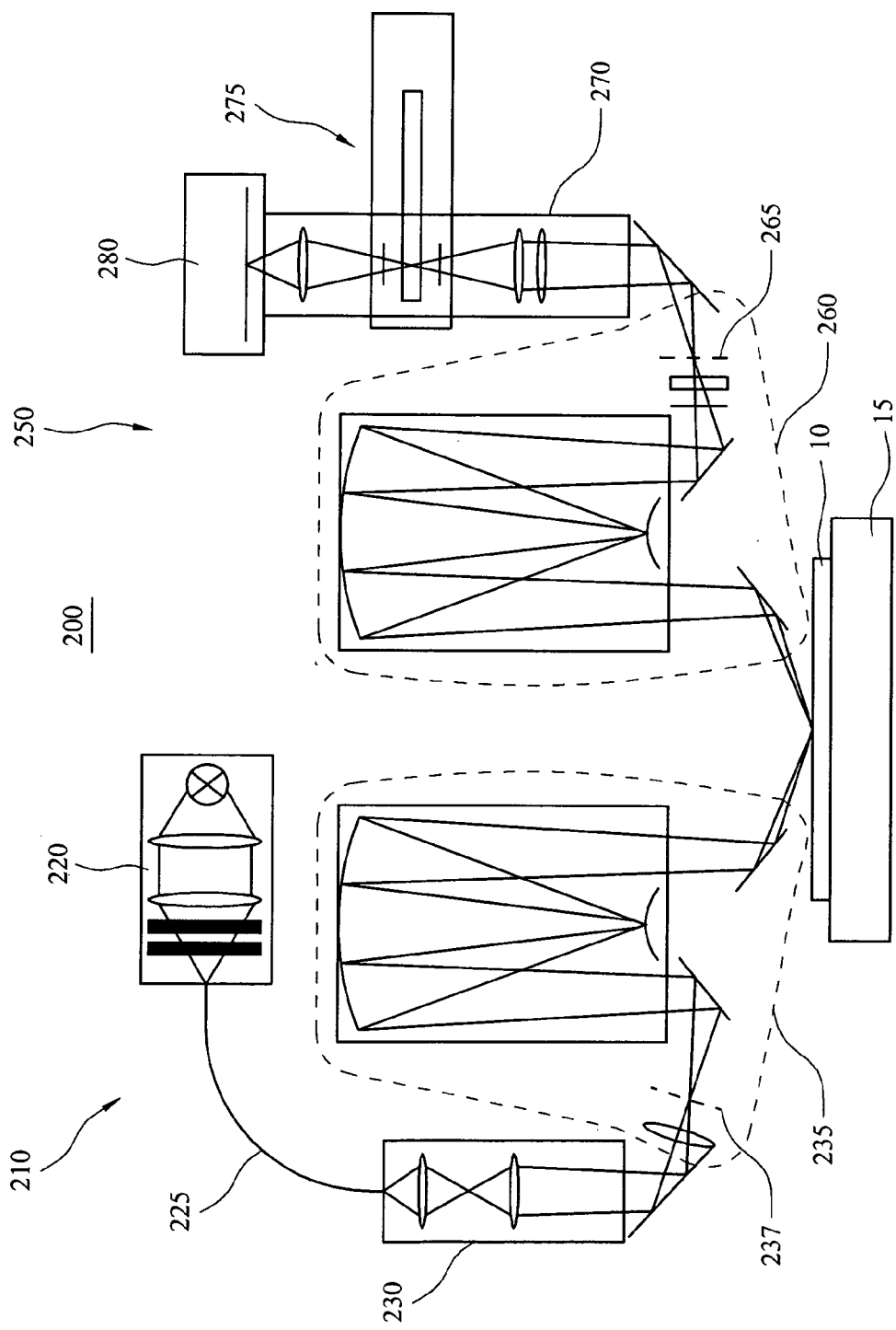
FIG. 9 is a schematic illustration of a wafer level sensor showing some of the major components.

The translation motion of the measurement spot array discussed above may be enabled by utilizing any one of a variety of known mechanisms. For example, conventional wafer level sensors are already equipped with a set of stepper motors to manipulate the position of the wafer stage. And the movement of the wafer required to achieve the translation motion of the measurement spot array are within the capabilities of most wafer level sensors without any additional actuating devices may be achieved through the software that controls the wafer stage movement in most conventional wafer level sensors. However, if necessary or appropriate, additional actuating devices such as stepper motors may be added to a conventional wafer level sensor to move the necessary components in order to translate the measurement spot array as desired. FIG. 9 is a schematic illustration of a typical wafer level sensor system 200 showing the major components. The typical wafer level sensor 200 comprises primarily two sections, a projection component 210 and a detection component 250. The projection component 210 comprises a light source 220, a light guide 225, illumination optics 230, and projection optics 235. The projection optics 235 includes a projection grating diaphragm 237 for projecting the array of nine measurement spots on to the wafer 10. The wafer 10 is carried on a wafer stage 15. The detection component 250 comprises a detection optics 260, a modulation optics 270, a photo elastic modulator 275, and data acquisition module 280. The detection optics 260 includes a detection grating diaphragm 265 for receiving the light signals of the array of nine measurement spots reflected by the wafer 10. One method of translating the measurement spot array is to add two stepper motors, one motor to controllably move the projection optics 235 and another motor to controllably move the detection optics 260. Alternatively, the position of the wafer stage 15 may be adjusted in relation to the measurement spot array to produce the same effect as translating the measurement spot array itself. Since in actuality, the scanning motion during the wafer height mapping process is created by moving the wafer stage rather than moving the wafer level sensor's optical components, this alternative method of adjusting the position of the wafer stage to create the effect of translating the measurement spot array relative to the exposure fields of the wafer may be easier to implement.

While the foregoing invention has been described with reference to the above embodiments, various modifications and changes can be made without departing from the spirit of the invention. These various modifications are considered to be within the scope of the invention defined by the appended claims.

What is claimed is:

1. A method of wafer height mapping using a wafer level sensor, comprising the steps of:
   determining edge positions of an exposure field on a wafer, the exposure field having two edges defining a width of the exposure field;
   aligning an array of measurement spots to the exposure field, wherein the array of measurement spots is centered within the exposure field;
   translating the array of measurement spots in a first direction towards a first of the two edges of the exposure field until the first edge is substantially flush with a first closest measurement spot that is closest to the first edge and the first measurement spot being within the exposure field;
   scanning and mapping the exposure field, generating a first mapped height data of the exposure field;
   translating the array of measurement spots in a second direction towards a second of the two edges of the exposure field until the second edge is substantially flush with a second closest measurement spot that is closest to the second edge and the second measurement spot being within the exposure field; and
   scanning and mapping the exposure field a second time, generating a second mapped height data for the exposure field.

2. The method of claim 1, further comprising a step of merging the first and second mapped height data for the exposure field.

3. The method of claim 1, wherein the step of translating the array of measurement spots in the first direction is achieved by moving the wafer relative to the array of measurement spots.

4. The method of claim 1, wherein the step of translating the array of measurement spots in the first direction is achieved by moving the array of measurement spots relative to the wafer.

5. The method of claim 1, wherein the step of translating the array of measurement spots in the second direction is achieved by moving the wafer relative to the array of measurement spots.

6. The method of claim 1, wherein the step of translating the array of measurement spots in the second direction is achieved by moving the array of measurement spots relative to the wafer.

7. A method of wafer height mapping using a wafer level sensor, an exposure field having a width being defined on the wafer and the wafer level sensor measuring height of the wafer's surface using optical sensors based on moiré interference by generating an array of measurement spots, each of the measurement spots having an equal width, the method comprising the steps of:
   determining whether the width of the exposure field is a multiple of the width of one of the measurement spots;
   determining edge positions of the exposure field on the wafer, the exposure field having two edges defining the width of the exposure field;
   aligning the array of measurement spots to the exposure field, wherein the array of measurement spots is centered within the exposure field;
   translating the array of measurement spots in a first direction towards a first of the two edges of the exposure field until the first edge is substantially flush with a first closest measurement spot that is closest to the first edge and the first measurement spot being within the exposure field;
   scanning and mapping the exposure field, generating a first mapped height data of the exposure field;
   translating the array of measurement spots in a second direction towards a second of the two edges of the exposure field until the second edge is substantially flush with a second closest measurement spot that is closest to the second edge and the second measurement spot being within the exposure field; and
   scanning and mapping the exposure field a second time, generating a second mapped height data for the exposure field.

8. The method of claim 7, further comprising a step of merging the first and second mapped height data for the exposure field.

9. The method of claim 7, wherein the step of translating the array of measurement spots in the first direction is achieved by moving the wafer relative to the array of measurement spots.

10. The method of claim 7, wherein the step of translating the array of measurement spots in the first direction is achieved by moving the array of measurement spots relative to the wafer.

11. The method of claim 7, wherein the step of translating the array of measurement spots in the second direction is achieved by moving the wafer relative to the array of measurement spots.

12. The method of claim 7, wherein the step of translating the array of measurement spots in the second direction is achieved by moving the array of measurement spots relative to the wafer.

* * * * *